(12) United States Patent
Kim

(10) Patent No.: US 6,285,199 B1
(45) Date of Patent: Sep. 4, 2001

(54) DEVICE AND METHOD FOR OPTIMALLY DETECTING A SURFACE CONDITION OF WAFERS

(75) Inventor: Tae-Kye Kim, Cheongju-shi (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/229,991

(22) Filed: Jan. 14, 1999

(30) Foreign Application Priority Data

Jan. 14, 1998 (KR) .................................................. 98-851

(51) Int. Cl.[7] .................................................. G01R 31/302
(52) U.S. Cl. .......................................... 324/752; 250/358.1
(58) Field of Search .................................... 324/751, 752, 324/753, 73.1, 158.1, 765; 250/358.1, 370.01, 372; 356/354, 237.5, 347, 357

(56) References Cited

U.S. PATENT DOCUMENTS

| 4,352,017 | * | 9/1982 | Duffy et al. ........................ 250/358.1 |
| 4,929,081 | * | 5/1990 | Yamamoto et al. ................. 356/354 |
| 5,289,260 | * | 2/1994 | Miyazaki et al. ..................... 356/354 |

* cited by examiner

Primary Examiner—Ernest Karlsen
Assistant Examiner—Minh Tang

(57) ABSTRACT

A device and method for optimally detecting the surface conditions of different types of wafers are disclosed. The device includes a light generating unit for impinging light on a wafer to generate a reflected light from the wafer, a combining unit including a plurality of filters having different light cut-off ratios for reducing the amount of the reflected light to generate a reduced amount of the reflected light depending on the reflection rate of the wafer, and a detection unit for processing the appropriately reduced amount of the reflected light to detect the surface condition of the wafer. A different filter or a different combination of the filters are selected depending on the reflection rate of the wafer being processed in order to appropriately reduce the amount of reflected light to be processed by the detection unit.

14 Claims, 3 Drawing Sheets

DEVICE AND METHOD FOR OPTIMALLY DETECTING A SURFACE CONDITION OF WAFERS

BACKGROUND OF THE INVENTION

1. Field of Invention

The present invention relates to a device and method for optimally detecting a surface condition of different types of wafers by automatically selecting filters to appropriately cut off a certain amount of reflected ray from impinging on an imaging sensor to process wafers with different surface properties.

2. Discussion of Related Art

FIG. 1 shows elements of a conventional device for detecting the surface condition of a wafer. Referring to FIG. 1, the conventional device comprises an Xe-lamp 1 for emitting a constant emissive ray, a filtering lens 3 for filtering the emissive ray from the Xe-lamp 1 within a band of 400~700 nm, a reticle 5 for adjusting the focus of the emissive ray transmitted through the filtering lens 3, a half mirror 7 for directing the filtered ray to a beam splitter 17 and to a mirror 8, the beam splitter 17 for splitting the ray reflected from the half mirror 7 to each PCD (Position Charge Device) sensor 13 and 15, the PCD sensors 13 and 15 determining the optimal points of automatic focus for the ray, amplifiers 19 and 21 for respectively amplifying signals output from the PCD sensors 13 and 15, an image processing device 23 for comparing the signals output from the amplifiers 19 and 21 to each other to determine the best optimal point of automatic focus for the wafer 27, a piezo driving device 25 for controlling a piezo member 29 to provide the best optimal focus point for the wafer 27 according to a signal output from the image processing device 23, and the piezo driving device 25 for controlling the piezo member 29. The piezo member 29 is placed on a side of the stage on which the wafer 27 is placed for three-dimensionally controlling the position of the stage.

The conventional device further comprises the mirror 8, an objective lens 9 for magnifying a ray reflected from a wafer 27 and directing it to the mirror 8, and a CCD (Charge Coupled Device) sensor 11 for representing surface condition of the wafer 27 based on the reflected ray output from the objective lens 9. The output of the CCD sensor 11 is processed by the image processing device 23 to determine any abnormality on the surface of the wafer 27.

An operation of the conventional device of FIG. 1 is as follows.

Referring to FIG. 1, an emissive ray is projected from the Xe-lamp 1 in the direction of the stage where the wafer 27 is placed. The emissive ray is filtered by the lens 3 to a wave band of 400~700 nm suitable for detecting particles. The filtered ray is reflected by the half mirror 7. The beam splitter 17 splits the reflected ray into two beams which are respectively directed to two PCD sensors 13 and 15. The amplifiers 19 and 21 respectively amplify the outputs of the PCD sensors 13 and 15.

The image processing device 23 determines the best optimal point of automatic focus for the wafer 27 by finding the intersection position of electrical signals output from the two PCD sensors 13 and 15, and generates a control signal to the piezo driving device 25. The piezo driving device 25 controls the piezo member 29 based on the control signal so that the Xe-lamp 1 projects light on the wafer 27 at the optimal point of automatic focus. That is, in accordance with a driving signal output from the piezo driving device 25, the piezo member 29 displaced at one side of the stage having the wafer 29 thereon is moved to achieve the optimal point of automatic focus for the light impinging on the wafer 27.

At the same time, the ray emitted from the Xe-lamp 1 and reflected from the wafer 27 passes through the objective lens 9 and is reflected by the mirror 8. Then this ray impinges on the CCD sensor 11, and is visualized subsequently to identify the pattern of the surface of the wafer 27. The CCD sensor 11 generates digital signals representing any abnormality (e.g., particles, dents, etc.) on the surface of the wafer 27. The principle of the CCD sensor 11 is to detect any displacement of the wafer surface by reading and analyzing light-receiving spots (photo-diode) of the reflected ray. The image processing device 23 processes the output of the CCD sensor 11 to detect an abnormality on the surface of the wafer 27.

In the conventional device of FIG. 1, the emissive ray from the Xe-lamp 1 is reflected at the surface of the wafer 27, and then transferred to the CCD sensor 11 so that the wafer surface can be examined. However, since the reflection rate at the surface of each wafer differs from each other, wafer abnormality will be detected only if the reflection rate of the wafer is high. Otherwise, surface abnormality of the wafer can not be detected effectively since the processing of a weak reflective ray by the CCD sensor can result in inaccurate detection results. Therefore, conventional detection devices and methods are not reliable when detecting the surface condition of different types of wafers.

SUMMARY OF THE INVENTION

Accordingly, the present invention is directed to a device and method for detecting particles on a wafer that substantially obviate one or more of the problems due to the limitations and disadvantages of the related art.

Therefore, it is an object of the present invention to provide a device and method for effectively detecting the surface condition of different types of wafers based on the reflection rates of the wafers.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, a device for detecting surface conditions of wafers, comprising a light generating unit for impinging light on a wafer to generate a reflected light; a combining unit, including a plurality of filters having different light cut-off ratios, for receiving the reflected light and outputting a varied amount of the reflected light; and a detection unit for receiving the varied amount of the reflected light from the combining unit and processing the received light to detect a surface condition of the wafer.

Furthermore, the present invention is directed to a method for detecting surface conditions of wafers, comprising the steps of impinging light on a wafer to generate a reflected light; generating a varied amount of the reflected light selectively using a plurality of filters having different light cut-off ratios; and processing the varied amount of the reflected light to detect a surface condition of the wafer.

It is to be understood that both the foregoing general description and the following detailed description are exemplary and explanatory and are intended to provide further explanation of the invention as claimed.

DESCRIPTION OF THE DRAWINGS

The accompanying drawings, which are included to provide a further understanding of the invention and are incorporated in and constitute a part of this application, illustrate embodiments of the inventing and together with the description serve to explain the principles of the invention.

In the drawings.

DETAILED DESCRIPTION OF THE PREFERRED EMBODIMENT

Reference will now be made in detail to the preferred embodiments of the present invention, example of which are illustrated in the accompanying drawings.

Figure 1:
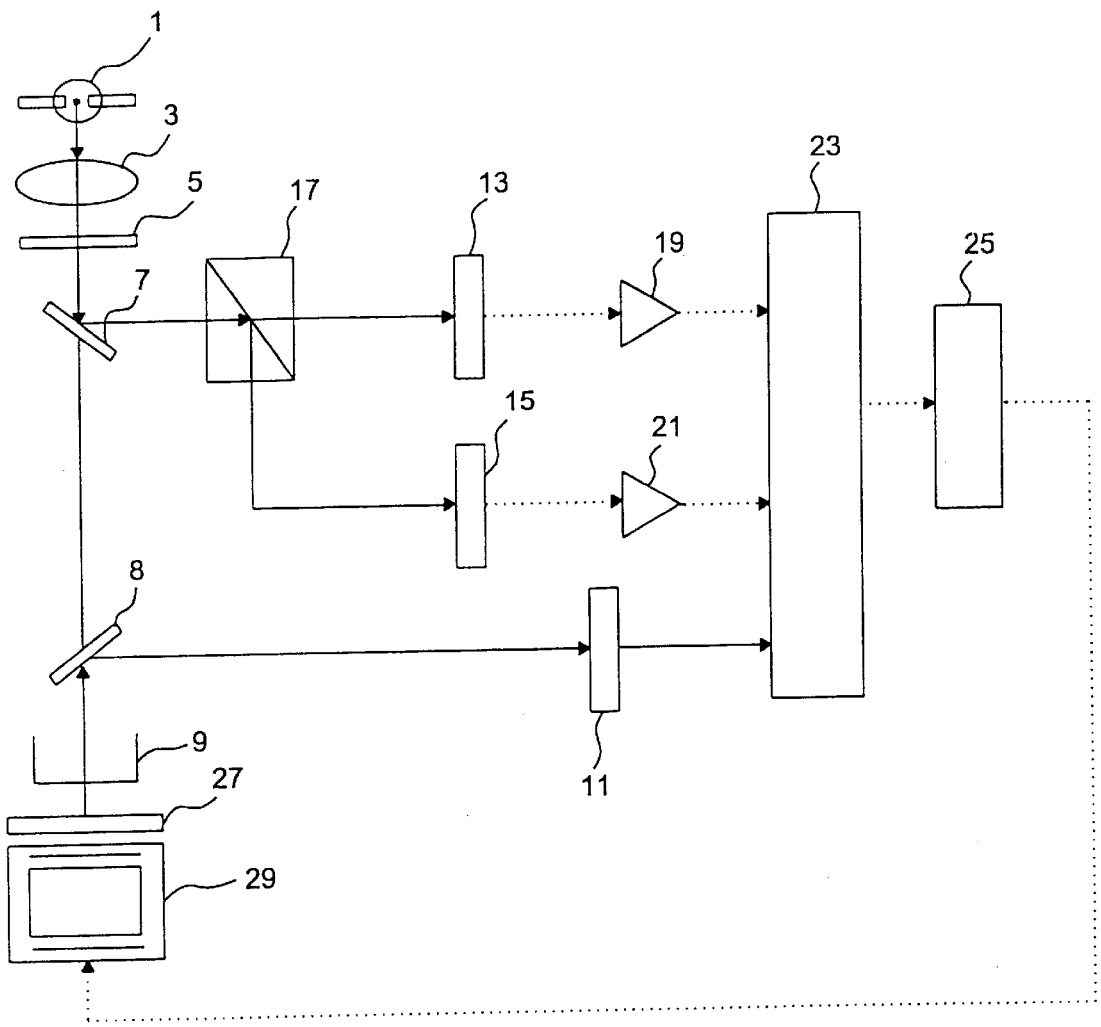
FIG. 1 shows a conventional device for detecting abnormal particles on a wafer.
Figure 2:
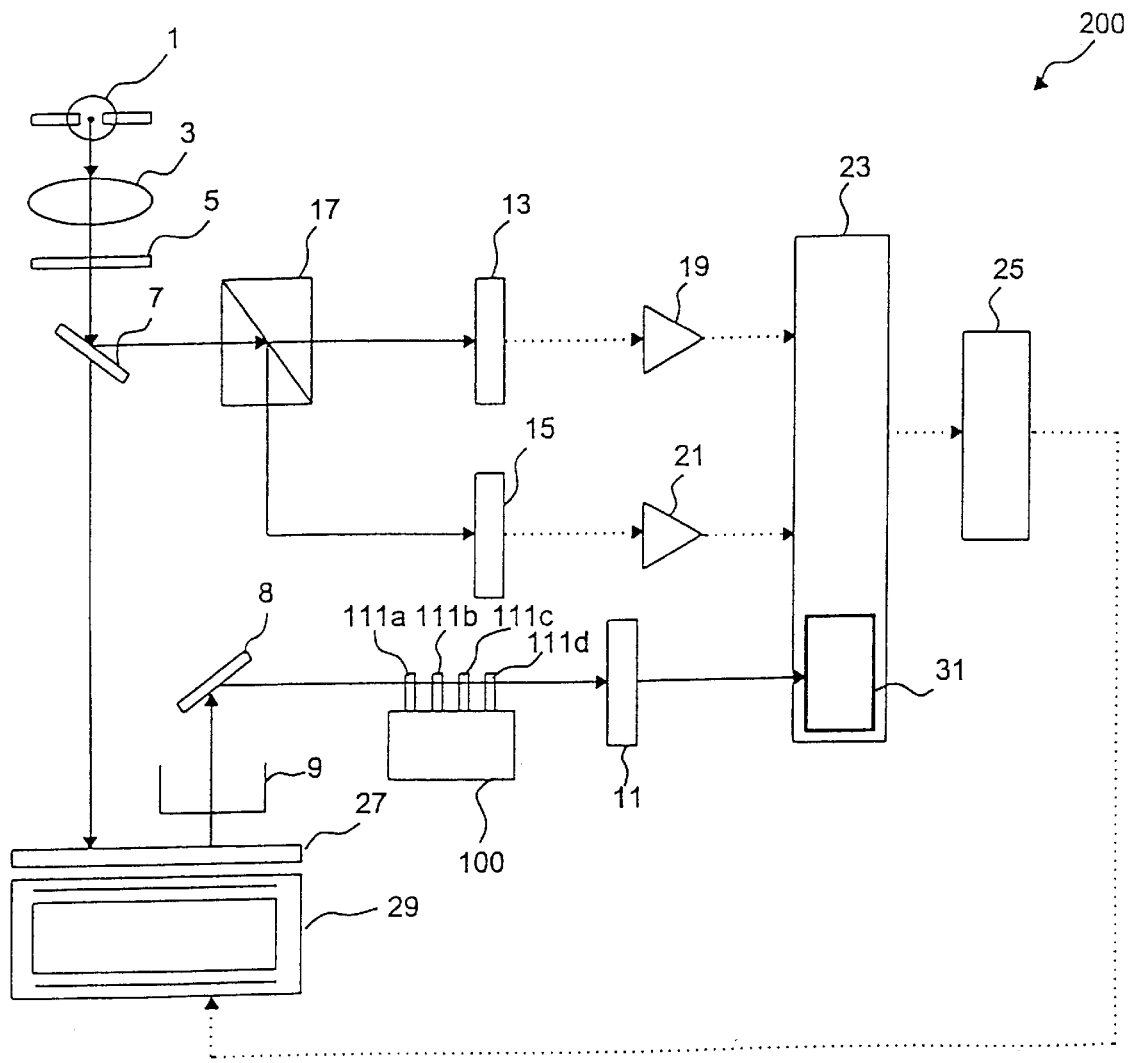
FIG. 2 shows a device for detecting the surface condition of wafers according to the present invention.

FIG. 2 shows a device 200 for detecting a surface condition of different wafers according to the present invention. The device 200 includes certain same elements as the conventional device of FIG. 1, as indicated by the same reference numerals. In addition, the device 200 of the present invention includes a filter combining unit 100.

A light source, e.g., Xe-lamp 1, emits a constant emissive ray towards a wafer 27. A filtering lens 3 filters the emissive ray to a predetermined wave band, e.g., 400~700 nm, and a reticle 5 focuses the filtered ray. A half mirror 7 projects the focused ray from the reticle 5 towards the wafer 27 and towards a beam splitter 17. The ray from the half mirror 7 is split into two beams by the beam splitter 17. The split rays pass through PCD sensors 13 and 15 and amplifiers 19 and 21 to an image processing device 23. The image processing device 23 determines the optimal point of automatic focus for the wafer 27 by determining the position of an intersection point of electrical signals from the two PCD sensors 13 and 15. Based on this determination signal output from the device 23, a piezo driving device 25 controls a piezo member 29 to obtain the optimal point of automatic focus for the wafer 27.

On the other hand, the ray from the Xe-amp 1 passing through the half mirror 7 impinges on and is reflected from the wafer 27. This reflected ray passes through the objective lens 9 and the reflection mirror 8, and is transmitted to the filter combining unit 100. The objective lens 9 magnifies the reflected ray onto the CCD sensor 11. The CCD sensor 11 converts the reflected ray (light) from the filter combining unit 100 into an electrical signal, and checks the surface of the wafer 27 to emit an output signal. The image processing device 23 processes the output signal of the CCD sensor 11 to display an image of the wafer surface on a monitor 31. The monitor 31 may be a part of the image processing device 23 or a separate unit from the image processing device 23.

The CCD sensor 11 includes a plurality of photo-arrays arranged in a matrix, and these photo-arrays corresponding to different portions of the wafer 27 respond to the reflected ray. The CCD sensor 11 measures a surface displacement or condition of the wafer 27 by reading the address of the photo-arrays that responded to the reflected ray, and provides video signals corresponding to this reading. The image processing device 23 processes the signals output from the CCD sensor 11, displays the video signals and converts them to digital signals. The output of the CCD sensor 11 may be visually displayed on the monitor 31 or other display units.

The image processing device 23 can also control the driving device 25 and the piezo member 29 to move the position of the stage or the wafer 27 according to the surface condition of the wafer 27 detected by the CCD sensor 11, as needed.

The filter combining unit 100 selects one or more filters to control the amount of the reflective ray to be impinged on the CCD sensor 11. The CCD sensor 11 measures any displacement on the surface of the wafer 27 and the objective lens 9 magnifies the ray reflected from the wafer 27.

Figure 3:
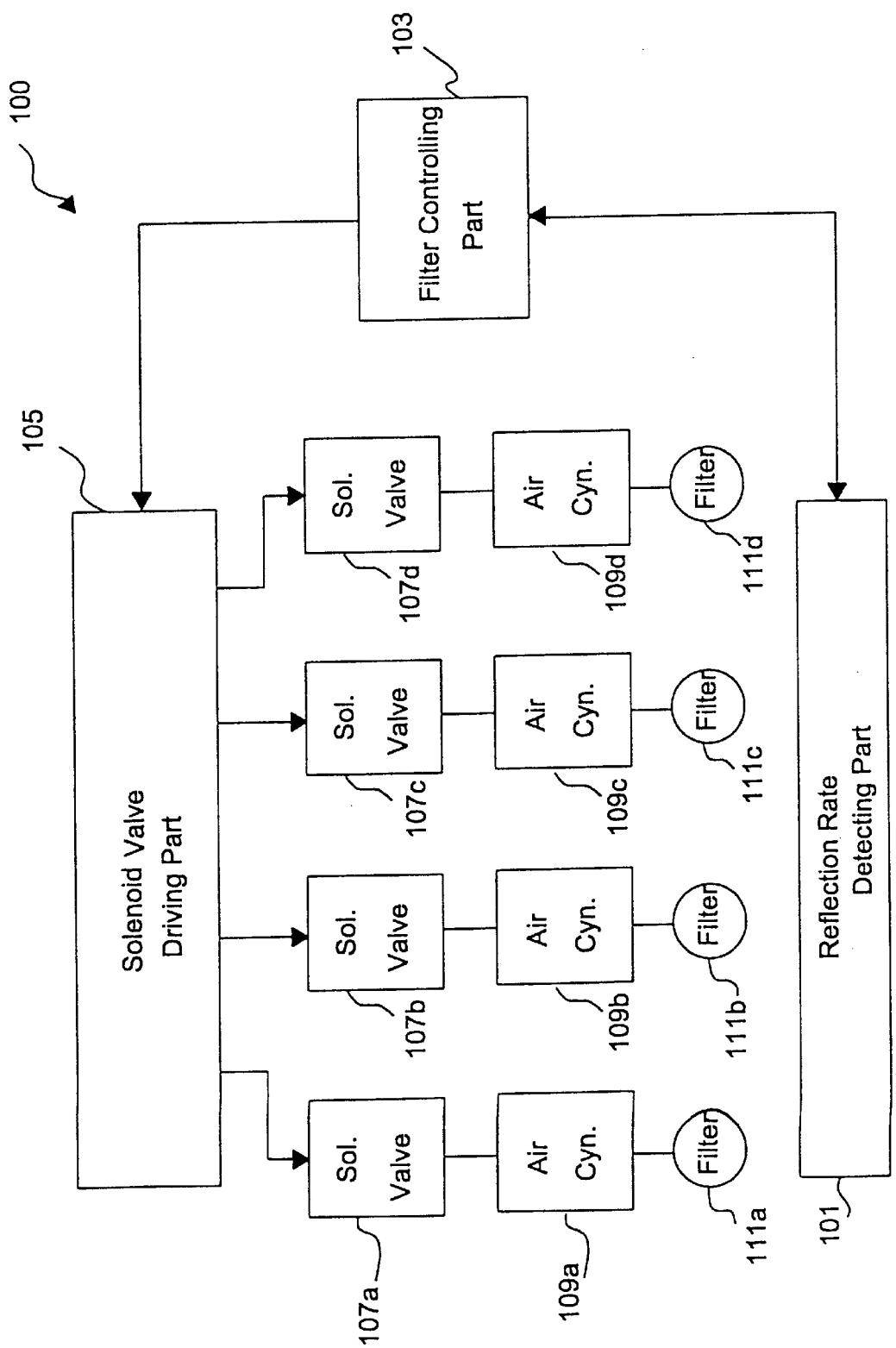
FIG. 3 shows an exemplary block diagram of a filter combining unit of the device shown in FIG. 2.

FIG. 3 shows a block diagram of the filter combining unit 100 for selectively combining filters according to the present invention. Referring to FIG. 3, the filter combining unit 100 includes a reflection rate detecting part 101 for detecting the reflection rate or reflectivity of each wafer 27 placed on the stage, and a filter controlling part 103 for selecting one or more of filters 111a to 111d according to the detected reflection rate of the wafer 27. The filters 111a to 111d have a light cut-off ratio or attenuation factor of 2, 5, 10, and 15%, respectively, but other light cut-off ratios may be used.

The filter controlling part 103 is connected to a solenoid valve driving part 105 for controlling the on/off-state of each solenoid valve 107a to 107d according to the signals output from the filter controlling part 103. In this example, air is supplied to air cylinders 109a to 109d through the solenoid valves 107a to 107d, each air cylinder 109a to 109d having a corresponding filter 111a to 111d attached or mounted thereto. By selectively combining the filters 111a to 111d according to the selective operation of the air cylinders 109a to 109d (i.e., by moving the filters in the path of the reflected ray), the amount of reflected ray impinging on the CCD sensor 11 is regulated at, e.g., 2 to 32%.

If the range of the light cut-off ratio according to the selective combination of filters 111a to 111d is adequate in controlling the amount of the reflected ray impinging on the CCD sensor 11 based on the scope of the reflection rate of the wafer in use, the combined cut-off ratio of the filters does not need to be greater than 32%. In the alternative, filters having other cut-off ratios can be selected and used depending on the desired performance need and reflection rate of wafers. For example, a filter having a cut-off ratio of 15% may be used for the wiring process of peripheral circuits using aluminum, a filter having a 10% cut-off ratio may be used for a bare wafer, and a filter having a cut-off ratio under 5% may be used for LOCOS process, and first gate, and second gate formation processes.

As mentioned above, the filter combining unit 100 includes the solenoid valves 107a to 107d, and the filters 111a to 111d respectively operated by the air cylinders 109a to 109d, and the solenoid valve operating part 105 for controlling or reducing the amount of the reflected ray impinging on the wafer 27. The air cylinders 109a to 109d are operated by opening/closing each solenoid valve 107a to 107d according to control signals output from the solenoid valve operating part 105. Although the solenoid valves and air cylinders are used to selectively actuate the filters, other types of mechanisms may be used to selectively place the filters 111a to 111d in the path of the reflected ray to reduce or increase the amount of reflected ray impinging on the CCD sensor 11.

When a new wafer is placed on the stage supported by the piezo member 29, and about 90% of the total emissive ray is desired from the Xe-lamp 1 to examine the surface abnormality or surface condition of the wafer 27, the rest (10%) of the total emissive ray of the Xe-lamp 1 is cut off before it arrives at the wafer 27 by using the filter 111c having the light cut-off ratio of 10%. If other cut-off amounts are desired, appropriate filters 111a to 111d are selectively used or combined with each other to obtain the desired reduction amount.

The proper amount of the ray that will result in the optimal wafer detection depends on a layer formed on the wafer. If the reflection rate of the layer formed on the wafer is high, the CCD sensor 11 can detect the abnormality of the wafer surface more accurately.

In accordance with the reflection rate of the layer formed on the wafer 27, a sufficient amount of ray is supplied to the wafer 27 based on the filter selection of the filter combining unit 100. Otherwise, as in the conventional device of FIG. 1, the process of detecting a surface condition of different types of wafers becomes ineffective and less reliable because the image detected by the CCD sensor 11 is not formed with clarity due to the inappropriate amount of reflected ray impinging on the CCD sensor 11.

The strength of the reflected ray from the wafer 27 is analyzed at the reflection rate detecting part 101 of the combining unit 100 wherein the reflected ray from the wafer 27 passes through the CCD sensor 11 and to the image processing device 23. If the analyzed amount of the ray is larger or smaller than a reference amount, the filter controlling part 103 generates signals of appropriate cut-off ratios to the solenoid valve driving part 105 to control the valves 107a–107d and the cylinders 109a–109d. Each air cylinder 109a to 109d opens or closes the corresponding solenoid valve 107a to 107d under control of the solenoid valve driving part 105, whereby the filters 111a to 111d are reciprocally moved by the shift of each air cylinder 109a to 109d.

More specifically, if the reflection rate of the wafer 27 is determined to be higher than that of a clean wafer, a filter having a cut-off ratio equal to or higher than, e.g., 15%, is used to reduce the amount of the reflected ray impinging on the CCD sensor 11. Otherwise, a filter having a cut-off ratio under, e.g., 5%, is used. The image processing device 23 can also analyze the signals output from the CCD sensor 11 to determine whether the appropriate filters were selected.

Hence, the amount of the reflected ray impinging on the CCD sensor 11 is regulated properly by the selective use or combination use of the filters 111a to 111d according to the reflection rate of the layer formed on the wafer 27. This provides a proper amount of reflected ray from the wafer 27 to be processed by the CCD sensor 11 to detect abnormality on the surface of the wafer 27.

As mentioned above, a device and method for detecting a surface condition of wafers according to the present invention improve the performance of the detecting process by controlling the amount of reflected ray impinging on the CCD sensor 11 using a proper combination of different filters having different light cut-off ratios based on the reflection rate of the wafer. Furthermore, the selective use of the filters 111a–111d may be applicable for the light path from the lamp 1 to the wafer 27. Moreover, the present invention provides efficient filters to cut off the reflected ray by automatically combining certain filters suitable for the reflection rate of the wafers.

It will be apparent to those skilled in the art that various modifications and variations can be made in the device and method for detecting particles on wafers according to the present invention without departing from the spirit or scope of the invention. Thus, it is intended that the present invention cover the modifications and variations of this invention provided they come within the scope of the appended claims and their equivalents.

What is claimed is:

1. A device for detecting surface conditions of wafers, the device comprising:

a light generating unit for impinging light on a wafer to generate reflected light;

a combining unit, including a plurality of filters having different light attenuation factors, for receiving the reflected light and outputting an attenuated amount of the reflected light;

a detection unit for receiving the attenuated amount of the reflected light from the combining unit and processing the received light to detect a surface condition of the wafer;

a reflection rate detector for detecting a reflectivity of the wafer; and a filter controller for controlling a selection of the filters based on said reflectivity; and a filter driving unit including:
      a solenoid valve driving unit operating under control of the filter controller;
      a plurality of solenoid valves operating under control of the solenoid valve driving unit; and
      a plurality of air cylinders, coupled to the solenoid valves, to move said at least one filter.

2. The device of claim 1, wherein the attenuation factors of the plurality of filters are 2%, 5%, 10%, and 15%.

3. The device of claim 1, wherein the detection unit includes:

a CCD sensor for detecting the varied amount of the reflected light from the combining unit and generating an electrical signal based on this detection.

4. The device of claim 3, wherein the detection unit further includes:

an image processor for receiving the electrical signal from the CCD sensor and analyzing the surface condition of the wafer based on the electrical signal.

5. The device of claim 1, further comprising:

a display unit for displaying an output of the detection unit.

6. The device of claim 4, further comprising:

an adjusting unit for determining an optimal point of automatic focus for the light impinging on the wafer and adjusting the position of the wafer based on this determination.

7. The device of claim 6, wherein the adjusting unit includes:

a plurality of position charge device (PCD) sensors for determining the optimal point of automatic focus; and a piezo unit for adjusting the position of the wafer based on the determination by the PCD sensors.

8. A method for detecting surface conditions of wafers, the method comprising:

impinging light on a wafer to generate reflected light;

selectively generating an attenuated amount of the reflected light using a plurality of filters having different attenuation factors by
      detecting a reflection rate of the wafer, and
      controlling a selection of the filters based on a result from the detection step; and processing the varied amount of the reflected light to detect a surface condition of the wafer; and selectively moving at least one of the filters into or out of a path of reflected light to produce attenuation thereof, based on the result of the detecting, by selectively actuating a plurality of solenoid valves and a plurality of air cylinders, coupled to the filters.

9. The method of claim 1, wherein in the generating step, the light attenuation factors of the plurality of filters are 2%, 5%, 10%, and 15%.

10. The method of claim 1, wherein the processing step is performed using a CCD sensor for detecting the varied amount of the reflected light and generating an electrical signal based on this detection.

11. The method of claim 10, wherein the processing step is further performed using an image processor for receiving the electrical signal from the CCD sensor and analyzing the surface condition of the wafer based on the electrical signal.

12. The method of claim 1, further comprising: displaying a result of the processing step.

13. The method of claim 1, further comprising: determining an optimal point of automatic focus for the light impinging on the wafer and adjusting the position of the wafer based on this determination.

14. The method of claim 13, wherein the determining step is performed using a plurality of position charge device (PCD) sensors for determining the optimal point of automatic focus, and a piezo unit for adjusting the position of the wafer based on the determination by the PCD sensors.

* * * * *